(12) United States Patent
Onitsuka (10) Patent No.: US 6,618,937 B2
(45) Date of Patent: Sep. 16, 2003

(54) METHOD OF ASSEMBLING ELECTRONIC APPLICATIONS AND DISPLAY DEVICES

(75) Inventor: Yasuto Onitsuka, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/877,112

(22) Filed: Jun. 11, 2001

(65) Prior Publication Data

US 2002/0004980 A1 Jan. 17, 2002

(30) Foreign Application Priority Data

Jun. 12, 2000 (JP) ........................................ 2000-175433

(51) Int. Cl.[7] ................................................ H05K 3/30
(52) U.S. Cl. ............................. 29/832; 29/740; 29/743; 156/538
(58) Field of Search ......................... 29/830, 832, 740, 29/743; 156/538, 540, 230, 238

(56) References Cited

U.S. PATENT DOCUMENTS

| 5,495,661 | A | * | 3/1996 | Gromer et al. ............... 29/740 |
| 5,727,311 | A | * | 3/1998 | Ida et al. ...................... 29/740 |
| 5,894,657 | A | * | 4/1999 | Kanayama et al. ........... 29/721 |
| 6,086,641 | A | * | 7/2000 | Shironouchi ............... 29/25.01 |
| 6,140,707 | A | * | 10/2000 | Plepys et al. ................ 257/668 |

* cited by examiner

Primary Examiner—Carl J. Arbes
Assistant Examiner—Tai Nguyen
(74) Attorney, Agent, or Firm—Wenderoth, Lind & Ponack, L.L.P.

(57) ABSTRACT

An assembly method for electronic appliances includes applying adhesive to a PCB; supplying an electronic component to the PCB; holding the electronic component with a mounting device and then placing the electronic component onto the PCB; pressing the electronic component onto the PCB; and detecting the electronic component held by the mounting device. The assembly method utilizes two or more bonders. This enables mounting and bonding of required components for assembling an electronic appliance using a single apparatus. In particular, the assembly method is effective for assembling display devices.

18 Claims, 7 Drawing Sheets

METHOD OF ASSEMBLING ELECTRONIC APPLICATIONS AND DISPLAY DEVICES

RELATED APPLICATION DATA

The present application claims priority to Japanese Application(s) No(s). P2000-302485 filed Oct. 2, 2000, which application(s) is/are incorporated herein by reference to the extent permitted by law.

FIELD OF THE INVENTION

The present invention relates to assembly apparatuses and assembly methods for assembling electronic appliances such as display devices by mounting electronic components onto printed circuit boards (hereafter referred to as PCBs).

BACKGROUND OF THE INVENTION

Electronic components such as driver semiconductor chips and flexible PCBs are mounted on PCBs during assembly of electronic appliances including liquid crystal display devices. Mounting takes place with the following sequence. First, adhesive material is applied to a chip mounting position on a PCB, and then a component is placed onto the adhesive material. Next, this component is heat pressed against the PCB under predetermined conditions to cure conductive adhesive and to fix the component to the PCB, and also to electrically connect electrodes on the component to electrodes on the PCB.

When adhesive is used during mounting, required positional accuracy and a pressing condition depend on a type of component to be mounted. An exclusive bonding device is thus conventionally needed for each type of component to be mounted. Accordingly, a plurality of bonding devices is linked to form an assembly system for electronic appliances, thus increasing system costs.

The present invention aims to provide an assembly apparatus and assembly method for electronic appliances such as display devices that enables reduction of assembly system costs.

SUMMARY OF THE INVENTION

An assembly apparatus for electronic appliances of the present invention comprises:

an adhesive applicator for applying adhesive to a PCB;
  a mounting section for placing an electronic component onto the PCB;
  two or more bonders for heat pressing the electronic component onto the PCB;
  a feeder for supplying the electronic component to the PCB;
  a mounting device for placing the electronic component on the PCB; and
  a detector for detecting the electronic component held by the mounting device.

The assembly apparatus for electronic appliances of the present invention has two or more bonders to handle each type of electronic component in a single apparatus. This enables mounting and bonding of required components for assembling an electronic appliance by using a single apparatus, thus allowing for reduction of system costs for assembling electronic appliances.

An assembly apparatus for display devices of the present invention comprises:

a conductive adhesive applicator for applying conductive adhesive onto a PCB;
  a mounting section for placing a semiconductor chip and flexible PCB onto the PCB where conductive adhesive is applied;
  a first bonder for heat pressing the semiconductor chip onto the PCB;
  a second bonder for heat pressing the flexible PCB onto the PCB;
  am exclusive feeder for supplying the semiconductor chip or flexible PCB respectively to the mounting section;
  an exclusive mounting nozzle for picking up the semiconductor chip or flexible PCB from the respective exclusive feeder and mounting it on the PCB; and
  a recognizer for detecting the semiconductor chip and flexible PCB held by the respective exclusive mounting nozzle.

The assembly apparatus for display devices of the present invention has a first bonder for bonding a semiconductor chip onto the PCB and a second bonder for heat pressing a flexible PCB onto the PCB. This enables a single apparatus to mount components required for assembly display devices on the PCB, thus leading to reduction of system costs.

DESCRIPTION OF THE PREFERRED EMBODIMENT

A preferred embodiment of the present invention is described below with reference to drawings, taking an assembly apparatus for display devices as an example of electronic appliances.

First, an overall configuration of the assembly apparatus for display devices is described with reference to FIG. 1.

Figure 1:
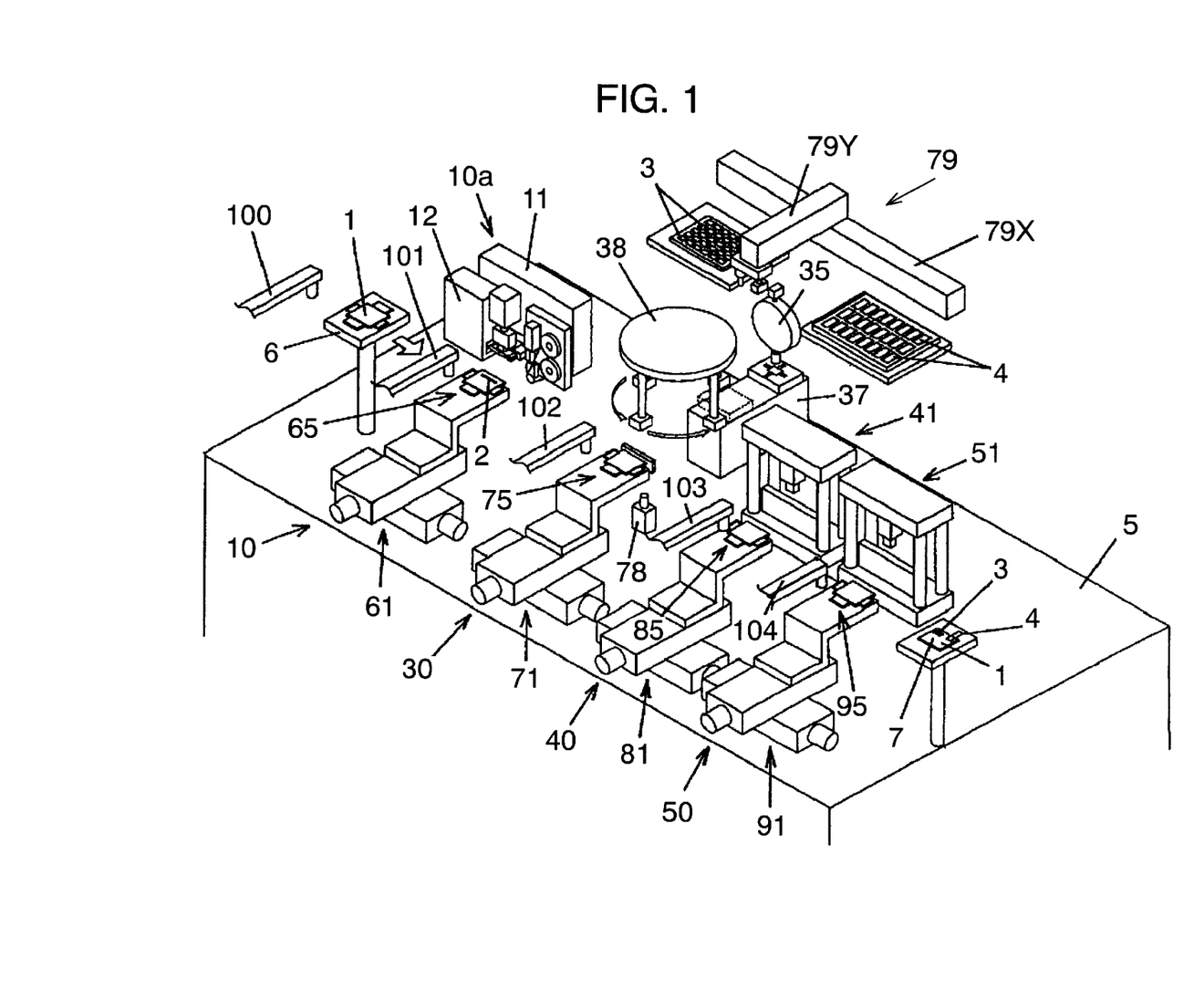
FIG. 1 is a perspective view of an assembly apparatus for display devices in accordance with a preferred embodiment of the present invention.

In FIG. 1, PCB or display panel 1 is supplied in the direction indicated by the broad arrow. The assembly apparatus for display devices in the preferred embodiment is set up by aligning four stations which are, respectively, from a supply direction of PCB 1, conductive adhesive applicator 10; mounting section 30; first bonder 40; and second bonder 50 on common base 5.

Applicator 10 cuts conductive adhesive tape (hereafter referred to as ACF tape), in which conductive adhesive 2 (hereafter referred to as ACF 2) is laminated onto a separator tape, to a predetermined length, and applies it to a predetermined position on PCB 1. Applicator 10 has first stage 65 on which PCB is placed, and first stage 65 is moved horizontally by moving table 61.

Mounting section 30 places semiconductor driver chip 3 (chip 3) and flexible PCB 4 on ACF2 applied to PCB 1. Mounting section 30 has second stage 75 on which PCB 1 is placed, and second stage 75 is moved horizontally by moving table 71.

First bonder 40 heats and presses placed chip 3 on PCB 1 for a predetermined time. Second bonder 50 heats and presses placed flexible PCB 4 on PCB 1 for a predetermined time. First bonder 40 and second bonder 50 have third stage 85 and fourth stage 95 on which PCB 1 is placed, and these stages are moved horizontally by moving tables 81 and 91, respectively.

Pre-centering stage 6 is provided to the PCB feeding side of first stage 65. Pre-centering stage 6 positions PCB 1 in advance, and supplies PCB 1 to first stage 65. Unloading stage 7 is provided at a substrate discharging side of fourth stage 95. Unloading stage 7 receives PCB 1 unloaded from fourth stage 95.

In order to vacuum-hold and transfer PCB 1 between stages, two or more transfer heads are provided as described below. Feeding head 100 vacuum-holds and transfers PCB 1 from pre-centering stage 6 to first stage 65. In the same way, first transfer head 101 vacuum-holds and transfers PCB 1 from first stage 65 to second stage 75; second transfer head 102 vacuum-holds and transfers PCB 1 from second stage 75 to third stage 85; third transfer head 103 vacuum-holds and transfers PCB 1 from third stage 85 to fourth stage 95; and unloading head 104 vacuum-holds and transfers PCB 1 from fourth stage 95 to unloading stage 7.

Figure 2:
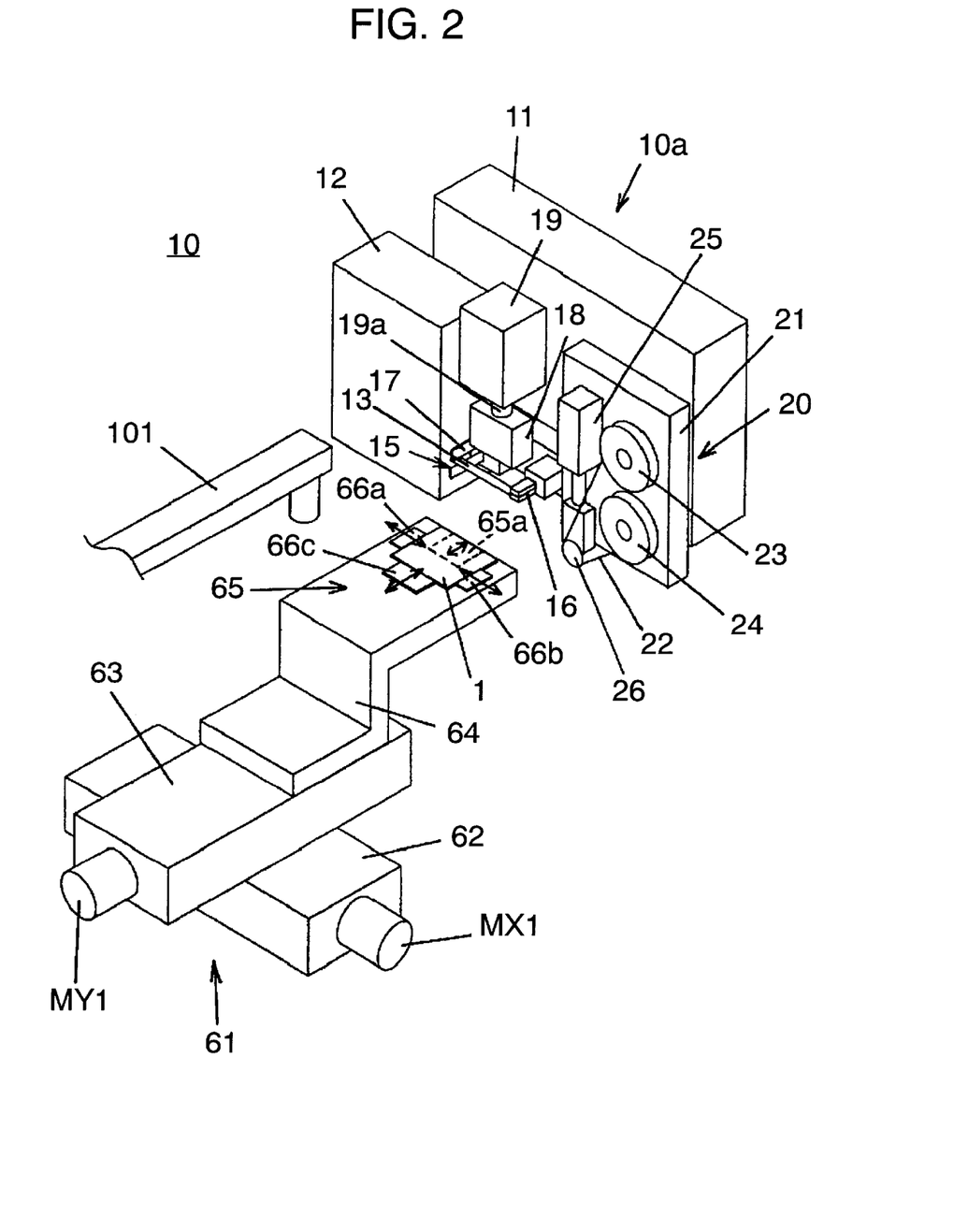
FIG. 2 is a perspective view of a conductive adhesive applicator of the assembly apparatus for display devices in accordance with the preferred embodiment of the present invention.

Next, conductive adhesive applicator 10 is described with reference to FIG. 2. Applicator 10 has tape application mechanism 10a and stage 65 for positioning PCB 1 with respect to tape application mechanism 10a. Tape application mechanism 10a consists of main frame 11 and other parts described next. Tape feeder 12 has a built-in mechanism for supplying ACF tape 13. ACF tape 13 consists of separator tape and ACF 2.

Tape take-out opening 15 for drawing out ACF tape 13 is provided on tape feeder 12. Chuck 16 comprises an open/close mechanism and horizontal feeding mechanism (not illustrated) for drawing out ACF tape 13 from tape take-out opening 15. Cutter 17, consisting of a pair of top and bottom cutting blades, is provided near opening 15. Cutter 17 vertically moves by virtue of a driving device (not illustrated) to cut ACF tape 13 drawn out from opening 15 to a predetermined length.

Suction head 18 is provided over ACF tape 13 drawn out by chuck 16. Suction head 18 is connected to rod 19a of cylinder 19, and is vertically moved by rod 19a. Suction head 18 is connected to a vacuum source (not illustrated), and vacuum-holds an object contacting its bottom face using vacuum inside suction head 18. Accordingly, when suction head 18 moves downwards and its end contacts the separator tape face of ACF tape 13 clamped by chuck 16, suction head 18 vacuum-holds ACF tape 13. In this state, cutter 17 cuts ACF tape 13. Suction head 18 is then further lowered, and presses and applies cut ACF tape 13 to PCB 1.

Peeling unit 20 for the separator tape is attached to main frame 11. Peeling unit 20 peels off only the separator tape from ACF tape 13 applied to PCB 1. Supply reel 23 and take-up reel 24 for adhesive tape 22 are provided on a front face of frame 21 of peeling unit 20. Cylinder 25 is disposed at a side of supply reel 23 and take-up reel 24. Roller 26 is mounted on a rod of cylinder 25. Adhesive tape 22 is drawn out from supply reel 23, and the tape travels around roller 26 and is wound onto take-up reel 24.

When the rod of cylinder 25 protrudes after peeling unit 20 is positioned over PCB 1, roller 26 moves downwards and presses adhesive tape 22 traveling around roller 26 against PCB 1. In this state, PCB 1 and roller 26 move in relation to each other so that adhesive tape 22 only peels off the separator tape of ACF tape 13 applied to PCB 1 when roller 26 rotates.

Stage 65 is described next also with reference to FIG. 2. First moving table 61 is disposed in front of tape application mechanism 10a. First Y table 63 is placed on first X table 62. MX1 and MY1 are driving motors respectively for X table 62 and Y table 63.

Support 64 is mounted on Y table 63, and bent in a direction of applicator 10. A top face of support 64 is stage 65. Stage 65 is provided with PCB receiver 65a and dampers 66a, 66b, and 66c. PCB receiver 65a and dampers 66a, 66b, and 66c are connected to drivers (not illustrated) driven by a common driving device, and respectively move in the directions of the arrows symmetrically about a center of placement position on stage 65.

An opening for suction (not illustrated) is provided on a top face of PCB receiver 65a to vacuum-hold PCB 1. More specifically, dampers 66a, 66b, and 66c push PCB 1, which is vacuum-held by PCB receiver 65a, from three directions when the driving device (not illustrated) is activated so that PCB 1 is positioned and fixed by vacuum to the center of placement position. Moving table 61 then adjusts a position of PCB 1, secured in this way, in X and Y directions with respect to tape application mechanism 10a.

Transfer head 101 is provided over stage 65. Transfer head 101 is a suction head which moves vertically and horizontally for vacuum-holding PCB 1 on stage 65 and transferring it to stage 75.

Figure 3:
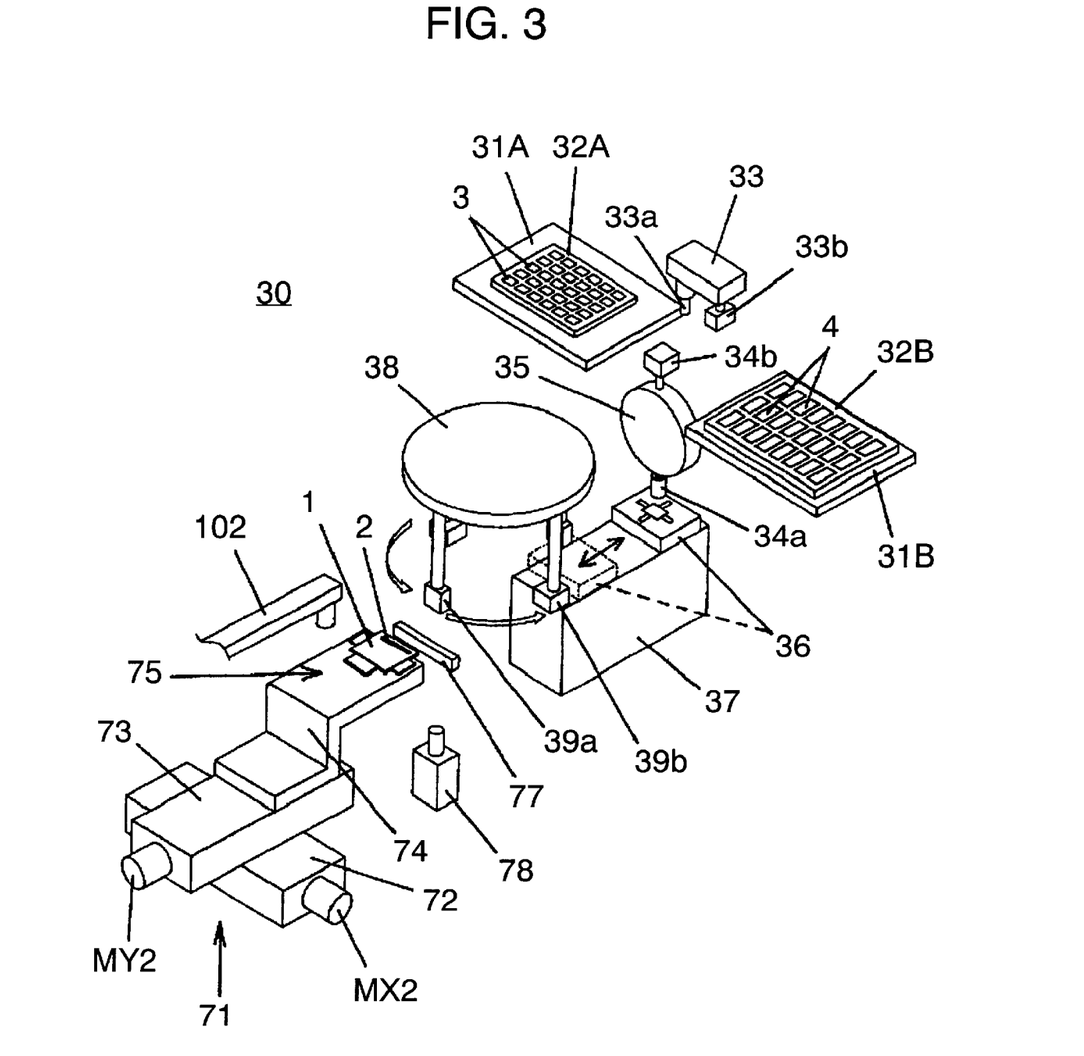
FIG. 3 is a perspective view of a mounting section of the assembly apparatus for display devices in accordance with the preferred embodiment of the present invention.

Next, configuration of mounter 30 is described with reference to FIG. 3. In FIG. 3, trays 32A and 32B are respectively provided on palettes 31A and 31B. Trays 32A and 32B respectively store chip 3 and flexible PCB 4, and supply them to a mounting mechanism described next. More specifically, trays 32A and 32B are exclusive feeders for respectively supplying chip 3 and flexible PCB 4.

As shown in FIG. 1, transfer table 79 consisting of X table 79X and Y table 79Y is disposed over trays 32A and 32B. Pickup head 33 is provided at transfer table 79. Pickup head 33 has suction nozzle 33a for holding chip 3 and suction nozzle 33b for holding flexible PCB 4. Pickup head 33 is horizontally moved by transfer table 79, and picks up chip 3 and flexible PCB 4 respectively from trays 32A and 32B by vacuum.

Turn over unit 35 is provided under pickup head 33. Turn over unit 35 is a rotatable disk to which holding head 34a for chip 3 and holding head 34b for flexible PCB 4 are provided on its rim. Holding heads 34a and 34b receive chip 3 and flexible PCB 4 respectively from suction nozzles 33a and 33b of pickup head 33 in a position facing directly upwardly.

Component pre-centering unit 36 is disposed directly under turn over unit 35. Component pre-centering unit 36 receives chip 3 and flexible PCB 4 from holding heads 34a and 34b of turn over unit 35. Here, turn over unit 35 rotates 180 degrees to turn over chip 3 and flexible PCB 4, and place them on component pre-centering unit 36. Component pre-centering unit 36 is provided with a centering mechanism to fix a position of chip 3 by pushing it from four directions. This component pre-centering unit 36 is mounted on support 37 so as to be slidable in the direction shown by the arrow.

Horizontally rotatable rotary head 38 is disposed over a front end of support 37. Rotary head 38 is a rotor which can detect position, and two types of mounting nozzles 39a and 39b are disposed in a vertically moving fashion at each indexing position.

Component pre-centering unit 36 centers chip 3 or flexible PCB 4, when received, and then slides to a position indicated by a dotted line in FIG. 3 for delivering chip 3 or flexible PCB 4 to mounting nozzle 39a or 39b. Mounting nozzles 39a and 39b place chip 3 or flexible PCB 4 received onto ACF 2 applied on PCB 1. Mounting nozzles 39a and 39b are exclusive mounting nozzles for vacuum-holding chip 3 or flexible PCB 4 supplied from respective trays 32A and 32B, and placing them on PCB 1. Rotary head 38 is a common transfer device for moving the exclusive mounting nozzles 39a and 39b to mount chip 3 or flexible PCB 4.

Support 77 made of a transparent material is disposed under a mounting position of mounting nozzles 39a and 39b. Support 77 supports an edge of PCB 1 from underneath when mounting nozzles 39a and 39b mount chip 3 or flexible PCB 4.

Camera 78 is provided underneath support 77. Camera 78 captures a bottom image of chip 3 or flexible PCB 4 held by mounting nozzle 39a or mounting nozzle 39b, and also a bottom image of PCB 1. In other words, camera 78 is an image capturing device for chip 3 and flexible PCB 4. Since support 77 is made of a transparent material, an image can be taken from underneath while the edge of PCB 1 is overlaid on a top face of support 77. Captured images are processed by an image processor (not illustrated) which detects positions of chip 3, flexible PCB 4, and PCB 1. Accordingly, camera 78 and image processor (not illustrated) constitute a recognizing device for chip 3 and flexible PCB 4.

Second moving table 71, comprising second Y table 73 and second X table 72 are provided on mounting section 30. Support 74 is disposed on table 73, and a top face of support 74 is second stage 75. A configuration of moving table 71 and stage 75 is identical to that for moving table 61 and stage 65. Stage 75 adjusts a position of PCB 1 when it is placed in a mounting position. Transfer head 102 is a suction head identical to transfer head 101, which vacuum-holds PCB 1 on stage 75 and transfers it to stage 85.

Figure 4:
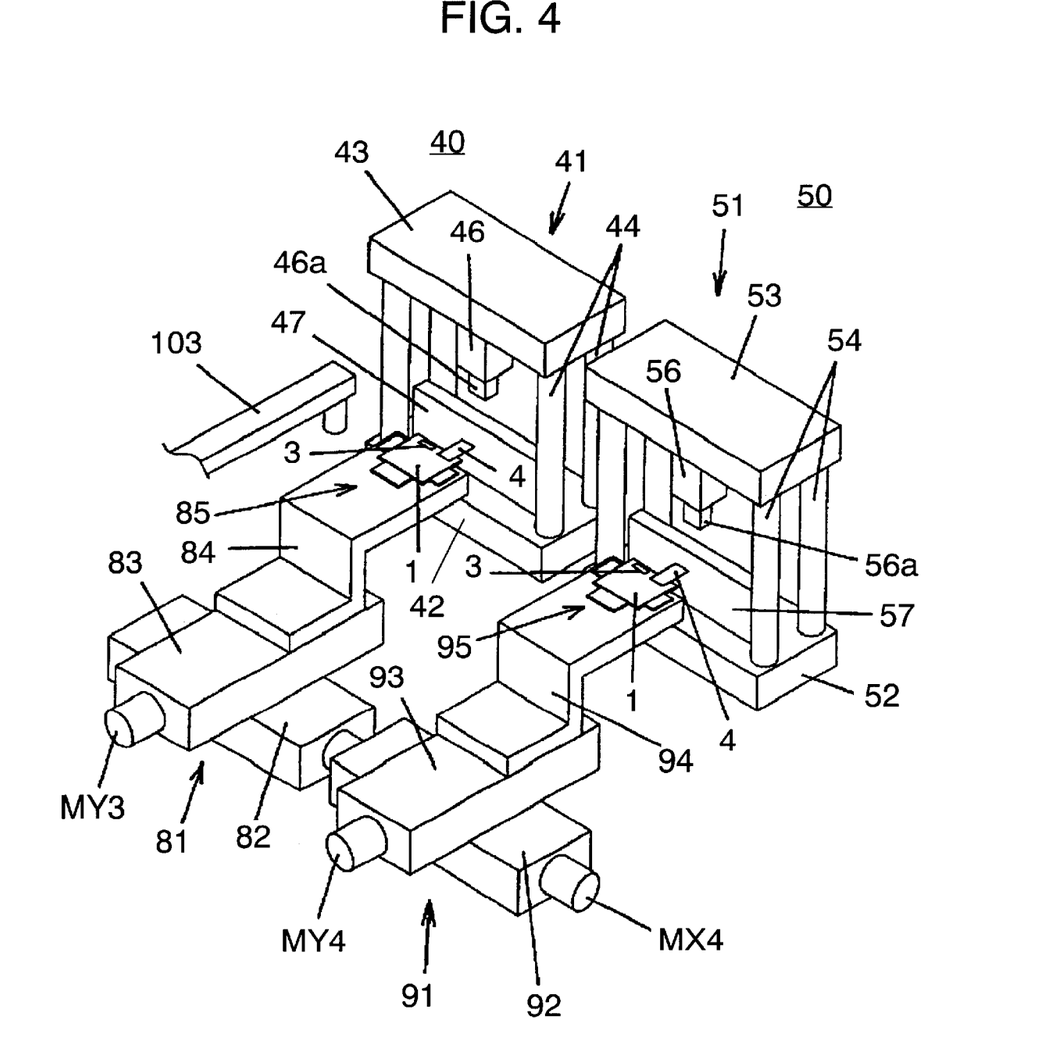
FIG. 4 is a perspective view of bonders of the assembly apparatus for display devices in accordance with the preferred embodiment of the present invention.

Next, first bonder 40 and second bonder 50 are described with reference to FIG. 4. First bonder 40 and second bonder 50 press chip 3 and flexible PCB 4 against PCB 1. These bonders in turn have gate-type pressing mechanisms 41 and 51 which have identical structure. The pressing mechanisms 41 and 51 respectively have bottom plates 42 and 52, top plates 43 and 53, and columns 44 and 54. First bonding head 46 and second bonding head 56 are disposed respectively on top plates 43 and 53.

Bonding head 46 and bonding head 56 have pressing tools 46a and 56a for pressing chip 3 and flexible PCB 4 respectively. Pressing tools 46a and 56a apply heat to chip 3 and flexible PCB 4 respectively, and at the same time, apply force from above. Backups 47 and 57 are provided at a bonding position under pressing tools 46a and 56a. These backups 47 and 57 support a bonding load by backing a bottom face of PCB 1 when chip 3 and flexible PCB 4 are pressed.

Bonder 40 and bonder 50 are respectively provided with third moving table 81 comprising third Y table 83 and third X table 82, and fourth moving table 91 comprising fourth Y table 93 and fourth X table 92. Top faces of supports 84 and 94, disposed on tables 83 and 93 respectively, act as stages 85 and 95. Configurations of these moving tables and stages are identical to those of moving table 61 and stage 65. Stages 85 and 95 respectively adjust a position of PCB 1, when it is set, with respect to pressing mechanisms 41 and 51.

Transfer head 103 is a suction head identical to first transfer head 101. Transfer head 103 vacuum-holds PCB 1 on stage 85 and transfers it to stage 95. Unloading head 104 vacuum-holds PCB 1 on stage 95 and transfers it to unloading stage 7 illustrated in FIG. 1.

The assembly apparatus for electronic appliances of the present invention is configured as described above. Next, an overall operation is described with reference to drawings.

First, operation of conductive adhesive applicator 10 is described with reference to FIG. 2. In FIG. 2, chuck 16 draws out ACF tape 13 from tape feeder 12 to a predetermined length, and clamps a tip of the ACF tape 13. Then, suction head 18 moves downwards when cylinder 19 protrudes. Suction head 18 vacuum-holds ACF tape 13 when it contacts a top face of a separator tape of ACF tape 13.

Next, cutter 17 activates and cuts ACF tape 13. Chuck 16 then opens to release the clamped tip of ACF tape 13, and cut ACF tape 13 is vacuum-held only by suction head 18.

Figure 5A:
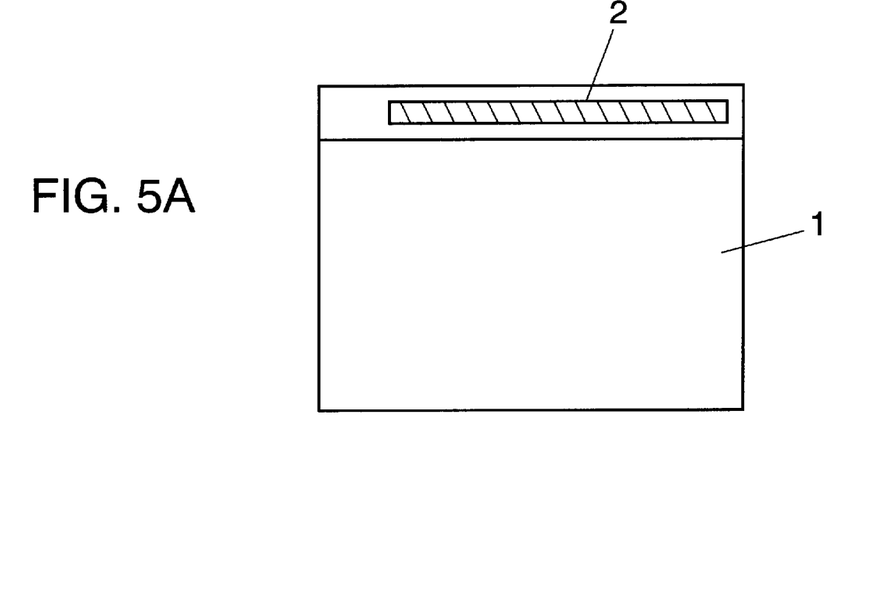
FIG. 5A is a plan view of a display device in accordance with the preferred embodiment of the present invention.
Figure 5B:
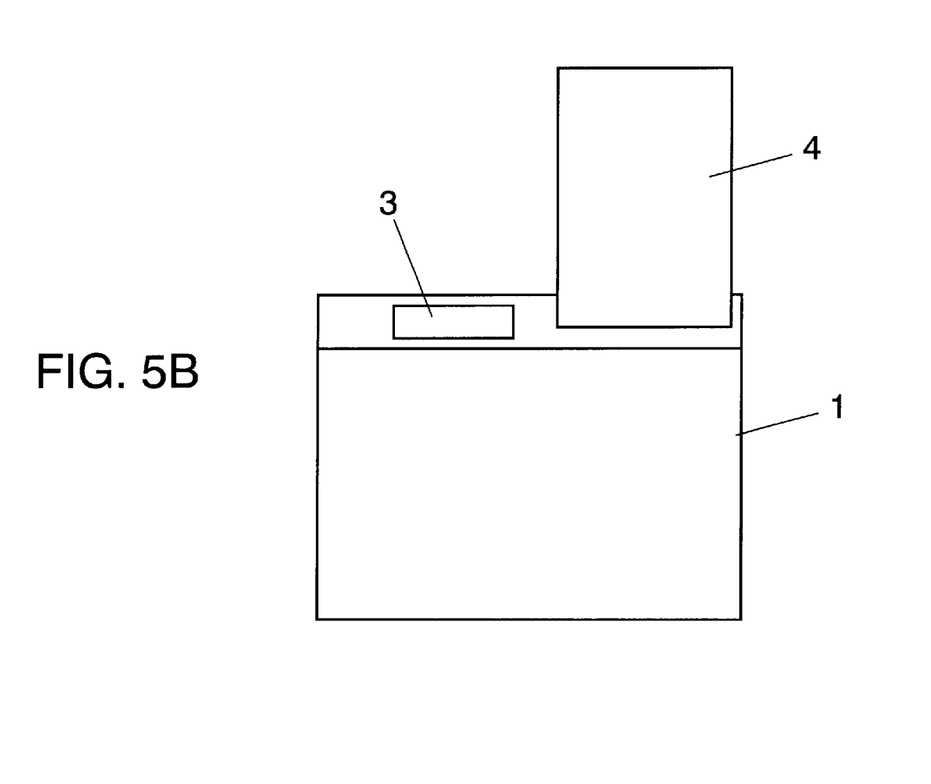
FIG. 5B is a plan view of a display device in accordance with the preferred embodiment of the present invention.

Suction head 18 then moves downwards to a top face of PCB 1 which is previously positioned, and applies cut ACF tape 13 to a predetermined position on the PCB to adhere ACF 2 to an edge of PCB 1 as shown in FIG. 5A. After applying the tape, suction head 18 rises to return to a standby position. ACF tape 13 is clamped at a position near to the supply side away from cutter 17 so that a free tip of ACF tape 13 protrudes to a. position of cutter 17. FIG. 5B illustrates an example of bonding two components (chip 3 and flexible PCB 4) using the same ACF tape 13. Different types of ACF tape may also be used depending on component types by providing two or more tape applicators.

Next, chuck 16 moves back while it is open. When chuck 16 clamps a tip of ACF tape 13 again, it starts to move forward again. With this operation, ACF tape 13 is drawn out for a predetermined length, which is the first state in the aforementioned description. Peeling unit 20 peels the separator tape on the surface of applied ACF tape 13 by adhering the separator tape onto a surface of adhesive tape 22.

The operation of first stage 65 is described next with reference to FIG. 1. PCB 1 positioned by pre-centering stage 6 is vacuum-held by feeding head 100, and transferred to stage 65. During transfer, dampers 66a, 66b, and 66c of stage 65 are in a retracted position. In other words, an area surrounded by front ends of dampers 66a, 66b, and 66c is greater than that of PCB 1. Accordingly, PCB 1 may be placed within this area surrounded by the front ends of dampers 66a, 66b, and 66c when transferring PCB 1. PCB 1 placed in this area is accurately positioned on stage 65 by the aforementioned centering function, and fixed to PCB receiver 65a in FIG. 2 by vacuum.

First stage 65, to which PCB 1 is set, moves forward to tape application mechanism 10a and positioned. ACF tape 13 is then applied to PCB 1 so positioned. After ACF tape 13 is applied, first stage 65 moves back to its position before applying the tape. Then, clampers 66a, 66b, and 66c are retracted and the vacuum applied by PCB receiver 65a is released. PCB 1 is free at this point allowing head 101 to transfer PCB 1. The same operation is implemented in other subsequent stages.

Next, operation of mounting section 30 is described with reference to FIG. 3. Chip 3 is stored in tray 32A with its bumps facing upwards. Flexible PCB 4 is stored in tray 32B with its connecting terminals facing upwards. Pickup head 33 slides in X direction, and picks up chip 3 in tray 32A. Pickup head 33 picks up flexible PCB 4 in tray 32B.

Chip 3 and flexible PCB 4 picked up in this way are transferred to holding heads 34a and 34b of turn over unit 35 with their bumps or connecting terminals facing upwardly. Turn over unit 35 turns 180° and transfers chip 3 and flexible PCB 4 to component pre-centering unit 36. The component pre-centering unit 36 slides to the position (shown by dotted line) for delivering chip 3 and flexible PCB 4 to mounting nozzles 39a and 39b. Mounting nozzles 39a and 39b move downwards to component pre-centering unit 36, vacuum-hold chip 3 or flexible PCB 4, and then rise.

Next, rotary head 38 rotates to a mounting position of chip 3 or flexible PCB 4, and stops to stand by. At the same time, PCB 1 to which ACF 2 is applied at stage 65 is transferred from stage 65 to stage 75. PCB 1 is centered on stage 75 in the same way as on stage 65, and is then adjusted to the mounting position.

Image capturing operations of camera 78 during positioning and mounting operations are described next with reference to FIGS. 6A–7.

Figure 6A:
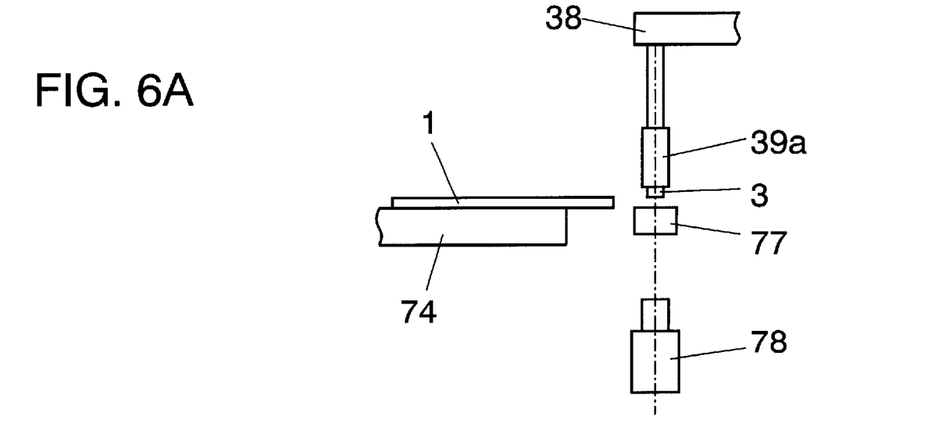
FIGS. 6A–6C are explanatory drawings illustrating a mounting operation during an assembly method for display devices in accordance with the preferred embodiment of the present invention.
Figure 6B:
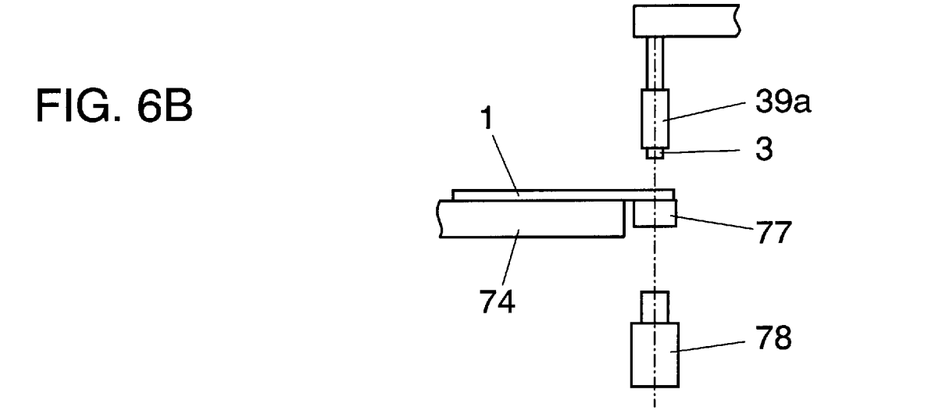
Figure 6C:
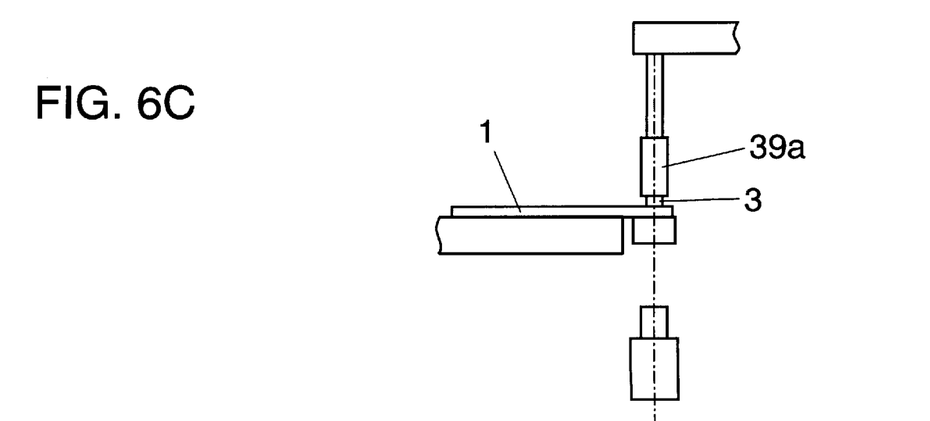
Figure 7:
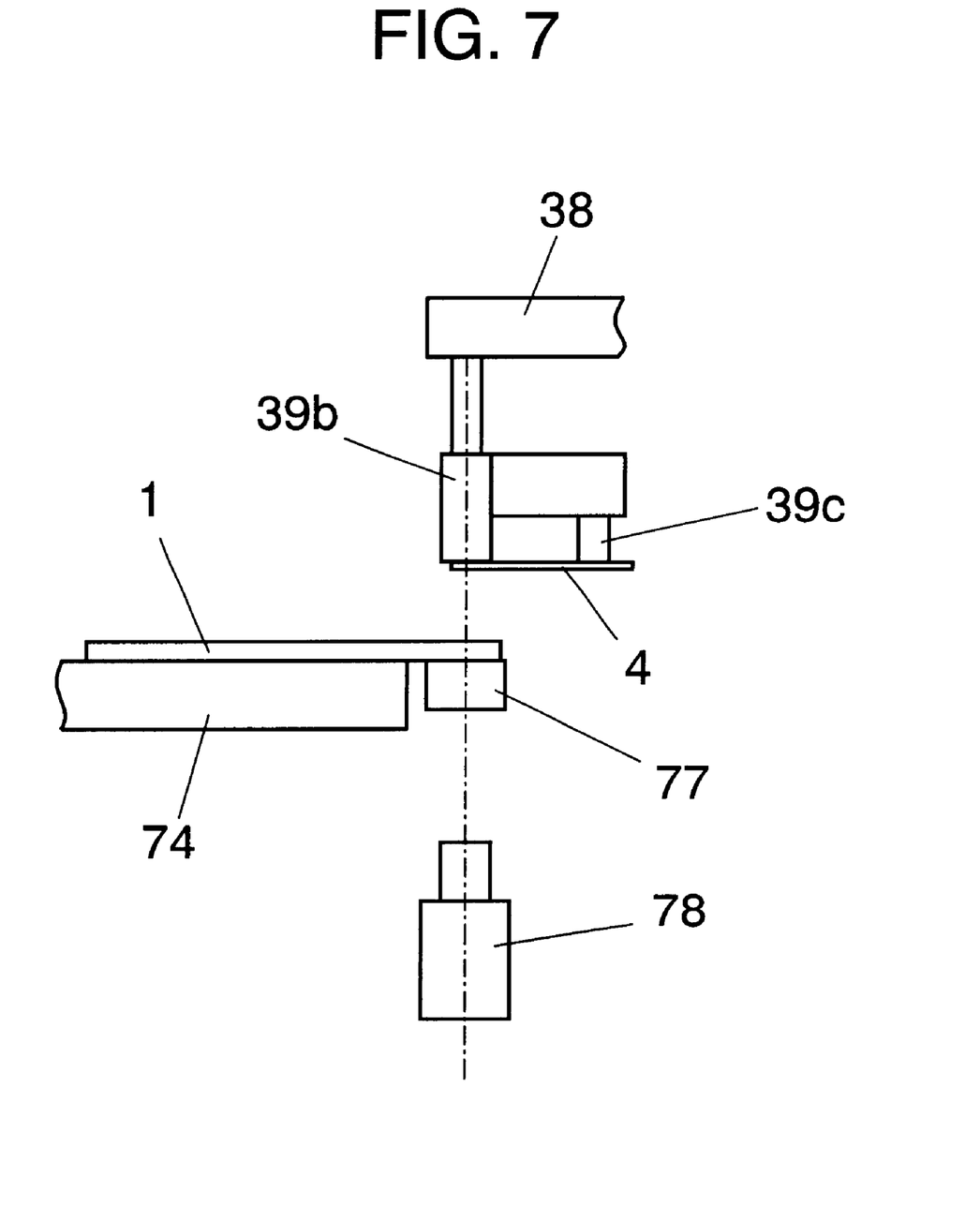
FIG. 7 is an explanatory drawing illustrating a mounting operation during an assembly method for display devices in accordance with the preferred embodiment of the present invention.

FIGS. 6A to 6C show image capturing and mounting operations of chip 3, and FIG. 7 shows an image capturing operation of flexible PCB 4. In FIG. 6A, rotary head 38 rotates to a position at which mounting nozzle 39a holding chip 3 is over camera 78. Mounting nozzle 39a then moves downwards to a position for capturing an image of chip 3. At this point, support 74 holding PCB 1 is in a retracted position. In this state, camera 78 captures a bottom face of chip 3 through transparent support 77. This enables detection of position of chip 3.

Next, as shown in FIG. 6B, moving table 71 is driven to move support 74 forward, after raising mounting nozzle 39a, so that an edge of PCB 1 is overlaid on a top face of support 77. In this state, camera 78 captures an image of the edge of PCB 1 through support 77 to detect a position of PCB 1. An image processor (not illustrated) identifies a relative dislocation of chip 3 and PCB 1 based on their respective position detection results, and then calculates compensation for dislocation.

Then, as shown in FIG. 6C, mounting nozzle 39a moves downwards to place chip 3 on the edge of PCB 1. During this mounting operation, the image processor drives moving table 71 to compensate for the aforementioned detected relative dislocation. Mounting of chip 3 is thus completed.

Next, flexible PCB 4 is mounted. As shown in FIG. 7, rotary head 38 rotates to set mounting nozzle 39b holding flexible PCB 4 over a mounting position. At this point, flexible PCB 4 is maintained horizontally by holding an edge of flexible PCB 4 by supplementary suction unit 39c. Also in this case, camera 78 captures an image of PCB 1 and detects a position of PCB 1 in the same manner as with mounting of chip 3; i.e. when the edge of PCB 1 is overlaid on support 77. According to this position detection result, the image processor compensates for a degree of dislocation, after which flexible PCB 4 is mounted on PCB 1.

Next, operations of bonder 40 and bonder 50 are described with reference to FIG. 4.

Transfer head 102 transfers PCB 1 on which chip 3 and flexible PCB 4 are mounted from stage 75 to stage 85. Then, PCB 1 is adjusted to a placement position on stage 85 by a centering function. Moving table 81 then positions stage 85 with respect to bonding head 46.

In this positioned state, the edge of PCB 1 is placed on receiver 47. Bonding head 46 then moves downwards. A tip of pressing tool 46a contacts a top face of chip 3 to heat and press chip 3 for a predetermined time. Here, a pressing force is received by receiver 47 so that no pressing load is applied to support 84. After a predetermined pressing time elapses, first bonding head 46 rises to complete bonding of chip 3.

Stage 85 then returns to its position before bonding. Transfer head 103 transfers PCB 1 after bonding chip 3 to stage 95. Bonder 50 then bonds flexible PCB 4 with the same sequence as used for bonding chip 3. After bonding flexible PCB 4 onto PCB 1, unloading head 104 transfers PCB 1 to unloading stage 7. This completes assembly of the display device onto which chip 3 and flexible PCB 4 are mounted to PCB 1.

An example of a display device is described above. But, the assembly apparatus of the present invention is not limited to a display device, but can be used for assembly of many kind of electronic appliances. The assembly apparatus for electronic appliances of the present invention is equipped with two or more bonders corresponding to each type of electronic component in a single apparatus. Accordingly, the present invention enables bonding and mounting of required electronic components onto a PCB using only one assembly apparatus, thus leading to reduced system costs for assembling electronic appliances assembled by bonding different types of electronic components.

The preferred embodiment also refers to an example of use of suction heads as devices for mounting components onto the PCB. However, a range of chucks, for example, may be used for larger components.

The assembly apparatus of the present invention as described above also comprises a mounter for mounting semiconductor chips and flexible PCBs onto a PCB to which conductive adhesive is applied; a first bonder for bonding semiconductor chips mounted on the PCB; and a second bonder for bonding flexible PCBs mounted on the PCB. This makes it possible to mount and bond two or more components required for assembling a display device using a single apparatus, thus leading to reduction of equipment costs.

What is claimed is:

1. A method for assembling an electronic appliance, comprising:

applying adhesive to a first printed circuit board;

placing a semiconductor chip onto said first printed circuit board by holding said semiconductor chip with a first nozzle, that is disposed on a moving device, and moving said moving device so as to bring said semiconductor chip into a chip mounting position;

placing a flexible printed circuit board onto said first printed circuit board by holding said flexible printed circuit board with a second nozzle, that is disposed on said moving device, and moving said moving device so as to bring said flexible printed circuit board into a board mounting position; and after said semiconductor chip and said flexible printed circuit board have been placed onto said first circuit board, bonding said semiconductor chip and said flexible printed circuit board to said first printed circuit board via said adhesive.

2. The method according to claim 1, further comprising recognizing said semiconductor chip, and recognizing said flexible printed circuit board.

3. The method according to claim 2, wherein said moving device comprises a rotary head such that moving said moving device so as to bring said semiconductor chip into a chip mounting position comprises rotating said rotary head so as to bring said semiconductor chip into said chip mounting position, and such that moving said moving device so as to bring said flexible printed circuit board into a board mounting position comprises rotating said rotary head so as to bring said flexible printed circuit board into said board mounting position.

4. The method according to claim 3, wherein applying adhesive to a first printed circuit board comprises applying conductive adhesive to said first printed circuit board.

5. The method according to claim 3, wherein recognizing said semiconductor chip comprises recognizing said semiconductor chip when said semiconductor chip is in said chip mounting position, and recognizing said flexible printed circuit board comprises recognizing said flexible printed circuit board when said flexible printed circuit board is in said board mounting position.

6. The method according to claim 3, wherein recognizing said semiconductor chip comprises using a camera to recognize said semiconductor chip, and recognizing said flexible printed circuit board comprises using a camera to recognize said flexible printed circuit board.

7. The method according to claim 1, further comprising:
detecting a position of said semiconductor chip when said semiconductor chip is in said chip mounting position; and
detecting a position of said first printed circuit board,
wherein placing said semiconductor chip onto said first printed circuit board further includes using the detected position of said semiconductor chip and the detected position of said first printed circuit board to adjust, as necessary, a relative positioning between said first printed circuit board and said semiconductor chip.

8. The method according to claim 7, further comprising:
detecting a position of said flexible printed circuit board when said flexible printed circuit board is in said board mounting position; and
detecting another position of said first printed circuit board,
wherein placing said flexible printed circuit board onto said first printed circuit board further includes using the detected position of said flexible printed circuit board and the detected another position of said first printed circuit board to adjust, as necessary, a relative positioning between said first printed circuit board and said flexible printed circuit board.

9. The method according to claim 8, wherein said moving device comprises a rotary head such that moving said moving device so as to bring said semiconductor chip into a chip mounting position comprises rotating said rotary head so as to bring said semiconductor chip into said chip mounting position, and such that moving said moving device so as to bring said flexible printed circuit board into a board mounting position comprises rotating said rotary head so as to bring said flexible printed circuit board into said board mounting position.

10. A method for assembling a display device, comprising:
applying adhesive to a first printed circuit board;
placing a semiconductor chip onto said first printed circuit board by holding said semiconductor chip with a first nozzle, that is disposed on a moving device, and moving said moving device so as to bring said semiconductor chip into a chip mounting position;
placing a flexible printed circuit board onto said first printed circuit board by holding said flexible printed circuit board with a second nozzle, that is disposed on said moving device, and moving said moving device so as to bring said flexible printed circuit board into a board mounting position; and
after said semiconductor chip and said flexible printed circuit board have been placed onto said first circuit board, bonding said semiconductor chip and said flexible printed circuit board to said first printed circuit board via said adhesive.

11. The method according to claim 10, further comprising recognizing said semiconductor chip, and recognizing said flexible printed circuit board.

12. The method according to claim 11, wherein said moving device comprises a rotary head such that moving said moving device so as to bring said semiconductor chip into a chip mounting position comprises rotating said rotary head so as to bring said semiconductor chip into said chip mounting position, and such that moving said moving device so as to bring said flexible printed circuit board into a board mounting position comprises rotating said rotary head so as to bring said flexible printed circuit board into said board mounting position.

13. The method according to claim 12, wherein applying adhesive to a first printed circuit board comprises applying conductive adhesive to said first printed circuit board.

14. The method according to claim 12, wherein recognizing said semiconductor chip comprises recognizing said semiconductor chip when said semiconductor chip is in said chip mounting position, and recognizing said flexible printed circuit board comprises recognizing said flexible printed circuit board when said flexible printed circuit board is in said board mounting position.

15. The method according to claim 12, wherein recognizing said semiconductor chip comprises using a camera to recognize said semiconductor chip, and recognizing said flexible printed circuit board comprises using a camera to recognize said flexible printed circuit board.

16. The method according to claim 10, further comprising:
detecting a position of said semiconductor chip when said semiconductor chip is in said chip mounting position; and
detecting a position of said first printed circuit board,
wherein placing said semiconductor chip onto said first printed circuit board further includes using the detected position of said semiconductor chip and the detected position of said first printed circuit board to adjust, as necessary, a relative positioning between said first printed circuit board and said semiconductor chip.

17. The method according to claim 16, further comprising:
detecting a position of said flexible printed circuit board when said flexible printed circuit board is in said board mounting position; and
detecting another position of said first printed circuit board,
wherein placing said flexible printed circuit board onto said first printed circuit board further includes using the detected position of said flexible printed circuit board and the detected another position of said first printed circuit board to adjust, as necessary, a relative positioning between said first printed circuit board and said flexible printed circuit board.

18. The method according to claim 17, wherein said moving device comprises a rotary head such that moving said moving device so as to bring said semiconductor chip into a chip mounting position comprises rotating said rotary head so as to bring said semiconductor chip into said chip mounting position, and such that moving said moving device so as to bring said flexible printed circuit board into a board mounting position comprises rotating said rotary head so as to bring said flexible printed circuit board into said board mounting position.

* * * * *